United States Patent
Shi et al.

(10) Patent No.: US 11,811,426 B2
(45) Date of Patent: Nov. 7, 2023

(54) DATA DECODING METHOD AND APPARATUS, AND COMPUTER STORAGE MEDIUM

(71) Applicant: SANECHIPS TECHNOLOGY CO., LTD., Shenzhen (CN)

(72) Inventors: Guangming Shi, Shenzhen (CN); Jialong Ding, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/624,980

(22) PCT Filed: Sep. 16, 2020

(86) PCT No.: PCT/CN2020/115615
§ 371 (c)(1),
(2) Date: Jan. 5, 2022

(87) PCT Pub. No.: WO2021/063181
PCT Pub. Date: Apr. 8, 2021

(65) Prior Publication Data
US 2022/0294477 A1    Sep. 15, 2022

(30) Foreign Application Priority Data
Sep. 30, 2019    (CN) .......................... 201910945166.3

(51) Int. Cl.
*H03M 13/00* (2006.01)
*H03M 13/29* (2006.01)

(52) U.S. Cl.
CPC .... *H03M 13/6572* (2013.01); *H03M 13/2948* (2013.01); *H03M 13/6502* (2013.01)

(58) Field of Classification Search
CPC ................................................. H03M 13/6572
See application file for complete search history.

(56) References Cited

U.S. PATENT DOCUMENTS

| 2013/0117344 A1* | 5/2013 | Gross | G06F 17/16 708/490 |
| 2018/0331697 A1 | 11/2018 | Lin et al. | |
| 2020/0083906 A1* | 3/2020 | Chen | H03M 13/39 |

FOREIGN PATENT DOCUMENTS

| CN | 104539296 A | 4/2015 |
| CN | 104038234 B | 9/2017 |

(Continued)

OTHER PUBLICATIONS

Yuqing Ren, Andreas Toftegaard Kristensen, Yifei Shen, Alexios Balatsoukas-Stimming, Chuan Zhang and Andreas Burg; A Sequence Repetition Node-Based Successive Cancellation List Decoder for 5G Polar Codes: Algorithm and Implementation; Submitted on May 18, 2022; (Year: 2022).*

(Continued)

*Primary Examiner* — Joseph D Torres
(74) *Attorney, Agent, or Firm* — Vivacqua Crane, PLLC (57) ABSTRACT

Disclosed are a data decoding method and apparatus, and a computer storage medium. The data decoding method includes: after Polar code data to be decoded is acquired, transmitting the Polar code data to be decoded to at least two pre-configured independent U value calculation modules, the U value calculation modules being configured to calculate a U value required at a next iteration of a G node; controlling the at least two independent U value calculation modules to process the Polar code data to be decoded to obtain at least two sets of new decode data; and, processing the at least two sets of new decode data to obtain new Polar code data to be decoded.

13 Claims, 3 Drawing Sheets

(56) References Cited

FOREIGN PATENT DOCUMENTS

CN   107846261 A   3/2018
KR   20160098474 A   8/2016

OTHER PUBLICATIONS

International Searching Authority. International Search Report and Written Opinion for PCT Application No. PCT/CN2020/115615 and English translation, dated Dec. 16, 2020, pp. 1-12.
European Patent Office. Extended European Search Report for EP Application No. 20870679.6, dated Aug. 4, 2022, pp. 1-13.
Fan et al. "An Efficient Partial-Sum Network Architecture for Semi-Parallel Polar Codes Decoder Implementation," IEEE Transactions on Signal Processing, vol. 62, No. 12, Jun. 2014, pp. 3165-3179.
Li et al. "Parallel Decoders of Polar Codes," arXiv preprint arXiv:1309.1026, 2013, pp. 1-4.
Raymond et al. "A Scalable Successive-Cancellation Decoder for Polar Codes," IEEE Transactions on Signal Processing, vol. 62, No. 20, Oct. 2015, pp. 5339-5347.
Shrestha et al. "High-Speed and Hardware-Efficient Successive Cancellation Polar-Decoder," IEEE Transactions on Circuits and Systems II: Express Briefs, vol. 66, No. 7, Jun. 2014, pp. 1144-1148.
Korean Intellectual Property Office. Office Action for KR Application No. 10-2022-7000258 and English translation, dated Aug. 29, 2023, pp. 1-8.

* cited by examiner

DATA DECODING METHOD AND APPARATUS, AND COMPUTER STORAGE MEDIUM

CROSS-REFERENCE TO RELATED APPLICATION

This application is a national stage filing under 35 U.S.C. § 371 of international application number PCT/CN2020/115615, filed Sep. 16, 2020, which claims priority to Chinese patent application No. 201910945166.3 filed Sep. 30, 2019. The contents of these applications are incorporated herein by reference in their entirety.

TECHNICAL FIELD

The present application relates to the field of information processing, for example, to a data decoding method and apparatus, and a computer storage medium.

BACKGROUND

Channel encoding is an important part in the wireless communication system. Through channel encoding, the receiver can correct wrong information during transmission, ensuring the communication quality of both communication parties. Polar code proposed by Arikan is a kind of channel encoding, and is a unique channel encoding method that can theoretically reach the Shannon limit. The low complexity and high performance of the Polar code exactly satisfy the requirements of channel encoding control in the 5th generation (5G) communication system. The successive cancellation decoding algorithm has become a mainstream Polar decoding algorithm. Most Polar decoding schemes are derived from the successive cancellation algorithm.

In the Polar decoding schemes, in order to save computing resources, Polar decoding is generally performed on the data to be processed in segments, but the segmentation operation on the data will lead to a too large coding delay. Therefore, the successive cancellation algorithm for Polar decoding has large delay, high process data storage overhead or other problems.

SUMMARY

The embodiments of the present application provide a data decoding method and apparatus, and a computer storage medium.

A data decoding method is provided, including:

after Polar code data to be decoded is acquired, transmitting the Polar code data to be decoded to at least two pre-configured independent U value calculation modules, the U value calculation modules being configured to calculate a U value required at a next iteration of a G node;

controlling the at least two independent U value calculation modules to process the Polar code data to be decoded to obtain at least two sets of new decode data; and processing the at least two sets of new decode data to obtain new Polar code data to be decoded.

A data decoding apparatus is further provided, including a processor and a memory, where the memory has computer programs stored thereon which, when executed by the processor, cause the processor to implement the data decoding method described above.

An embodiment of the present application further provides a computer storage medium having one or more programs stored thereon which, when executed by one or more processors, cause the one or more processors to implement the data decoding method described above.

DETAILED DESCRIPTION

The embodiments of the present application will be described below with reference to the accompanying drawings.

Figure 1:
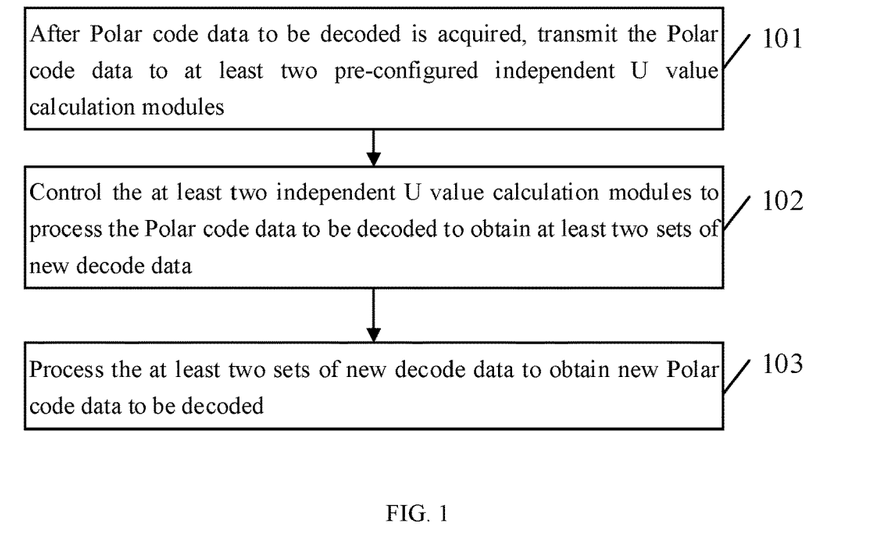
FIG. 1 is a flowchart of a data decoding method according to an embodiment of the present application.

FIG. 1 is a flowchart of a data decoding method according to an embodiment of the present application. The method shown in FIG. 1 includes the following steps of 101 to 103.

At step 101, after Polar code data to be decoded is acquired, the Polar code data to be decoded is transmitted to at least two pre-configured independent U value calculation modules, the U value calculation modules are configured to calculate a U value required at a next iteration of a G node.

In an embodiment, the U value calculation is distributed in at least two independent U value calculation modules, and how many bits of decoding U value calculation each U_CALC module contains should be divided according to hardware resources and layout to realize a tradeoff between performance and resources.

At step 102, the at least two independent U value calculation modules are controlled to process the Polar code data to be decoded to obtain at least two sets of new decode data.

In an embodiment, the Polar code data to be decoded is processed by the at least two independent U value calculation modules to obtain at least two sets of new decode data, thereby realizing parallel processing of decode data and improving the decoding efficiency.

At step 103, the at least two sets of new decode data are processed to obtain new Polar code data to be decoded.

In accordance with the method provided in this embodiment of the present application, after Polar code data to be decoded is acquired, the Polar code data is transmitted to at least two pre-configured independent U value calculation modules; the at least two independent U value calculation modules are controlled to process the Polar code data to be decoded to obtain at least two sets of new decode data; and, the at least two sets of new decode data are processed to obtain new Polar code data to be decoded. Thus, the parallel processing of decode data is realized, and the decoding efficiency is improved.

In an embodiment, before transmitting the Polar code data to be decoded to at least two pre-configured independent U value calculation modules, the method further includes: acquiring a Polar code tree corresponding to the Polar code data to be decoded; and, splitting the Polar code tree into s independent decoding sub-trees, s being an integer greater than or equal to 2, where the s independent decoding sub-trees are transmitted to s pre-configured independent U value calculation modules.

After the data to be decoded is acquired, a Polar code tree corresponding to the data to be decoded is acquired and is split into s independent decoding sub-trees, and a U value required at a next iteration of a G node is calculated by using the s independent decoding sub-trees. During the decoding process, segments are calculated independently of each other and do not depend on each other, so that the processing efficiency is improved.

In an embodiment, the data to be decoded is split by a Polar code tree, ensuring that the data of decoding sub-trees obtained after splitting can be independently processed subsequently.

In an embodiment, the splitting the Polar code tree into s independent decoding sub-trees includes:

acquiring a data extraction interval s for the Polar code tree; and, performing data extraction on the Polar code tree at a data extraction interval of s bits and in a Z-shaped data extraction order to obtain s independent decoding sub-trees.

In an embodiment, $s=2^k$, where k=1, 2, 3 . . . .

Figure 2:
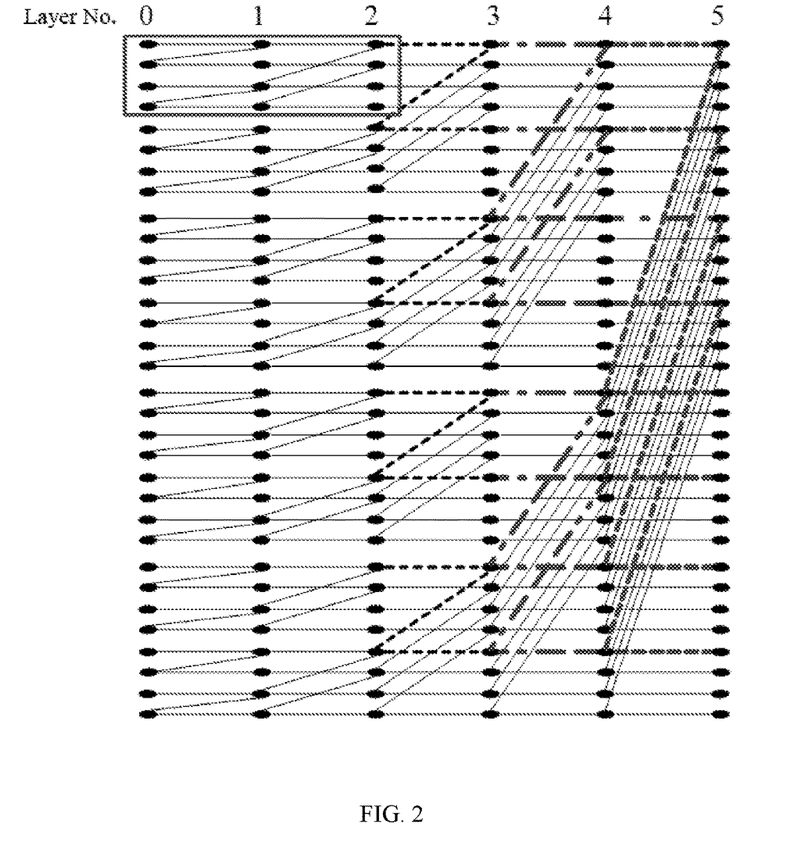
FIG. 2 is a schematic diagram of splitting a Polar code tree having a code length of 32 bits according to an embodiment of the present application.

FIG. 2 is a schematic diagram of splitting a Polar code tree having a code length of 32 bits according to an embodiment of the present application. As shown in FIG. 2, the process of constructing independent decoding sub-trees will be described below.

Data extraction is performed at an interval of 4 bits to construct 4 coding/decoding sub-trees.

The word Z formed by the thin line between layer 2 and layer 3 represents the a first level of extraction at an interval of 4 bits; the word Z formed by 2 dots and 3 lines between layer 3 and layer 4 represents a second level of extraction at an internal of 4 bits; and, the word Z formed by the broken line between layer 4 and layer 5 represents a third level of extraction at an interval of 4 bits. Thus, if the part represented by the solid black line is removed, the dashed line represents a complete sub coding/decoding binary tree, and the coding/decoding result and the calculation process are related to the data extracted at an interval of 4 bits. Similarly, other three coding/decoding trees extracted at an interval of 4 bits may also be complete sub coding/decoding binary trees that are calculated independently. The Polar code having a code length of 32 bits may be split into 4 independent Polar codes each having a code length of 8 bits, and the Polar codes having a code length of 8 bits are reused for calculation.

In an embodiment, the U value required at a next iteration of the G node is calculated by using the s independent coding sub-trees.

In an embodiment, the description is given by splitting the decoding tree into 4 decoding sub-trees by using a 4 bit-successive cancellation list (SCL) decoding algorithm as an example. In FIG. 2, successive Polar code decoding is performed on a coding/decoding array having a code length of 32 bits; the fifth column is a result of decoding first 4 bits of the input data calculated according to the Z shape; and, according to the obtained result of decoding 4 bits, a U value required in the process of decoding next 4 bits is calculated for decoding the next 4 bits.

The method provided in this embodiment of the present application will be described below.

In an embodiment, the splitting the Polar code tree into s independent decoding sub-trees includes the following steps of S1 to S4.

At step S1, a data extraction interval $s_i$ for the Polar code tree is acquired.

At step S2, data extraction is performed on the Polar code tree in a Z-shaped data extraction order and at a data extraction interval of $s_i$ bits to obtain $s_i$ independent decoding sub-trees.

At step S3, it is determined whether the number of the obtained independent decoding sub-trees reaches s, to obtain a result of determination.

At step S4, if the result of determination is that the number of the obtained independent decoding sub-trees does not reach s, the $s_i$ independent decoding sub-trees are split, the value of i is updated as i+1, and steps S1-S4 are repeated until the total number of the obtained decoding sub-trees reaches s, where i is a positive integer.

In an embodiment, when the code length is 1024, 2048, 4096 or more, it is possible to perform extraction at an internal of 8 bits or 4 bits after extraction at an internal of 4 bits until the design requirements of computing resources at an F node and a G node are satisfied, thereby achieving a tradeoff between the operation speed and the resource overhead.

In an embodiment, the controlling the at least two independent U value calculation modules to process the Polar code data to be decoded to obtain at least two sets of new decode data includes:

transmitting the s independent decoding sub-trees to s independent U value calculation modules, respectively; and, controlling each of the s independent U value calculation modules to process a respective one of the s independent decoding sub-trees to obtain s sets of new decode data.

In order to realize completely independent sub-decoding, the U value calculation modules are divided into a plurality of sub-modules for calculation in the way described in this embodiment. As described in this embodiment, the input data is divided into 4 independent sub-decoders at a data extraction interval of 4 bits, and 4 U_CALC sub-modules will be correspondingly used.

In an embodiment, the calculating the U value required at a next iteration of the G node by using the s independent decoding sub-trees includes:

splitting the pre-acquired decode data into s sets of decode data according to the pre-acquired strategy for splitting decode data, the strategy for splitting decode data being the same as a strategy for splitting the Polar code tree into s independent decoding sub-trees; processing the s independent decoding sub-trees using the s sets of decode data to obtain s sets of newly generated decode data corresponding to the s independent decoding sub-trees; and, processing the s sets of newly generated decode data to obtain complete new decode data.

Each U value calculation module U CALC extracts a decode value of each iteration at an internal of 4 bits. In this embodiment, if a 4-bit decode value dec[3:0] is output by each iteration of the 4-bit-SCL decoding algorithm, dec[0] is transmitted to the U_CALC_0, dec[1] is transmitted to the U_CALC_1, dec[2] is transmitted to the U_CALC_2, and dec[3] is transmitted to the U_CALC_3.

In an embodiment, the processing the at least two sets of new decode data to obtain new Polar code data to be decoded includes:

executing an operation reverse to splitting the decode data into s sets of decode data, to restore the s sets of newly generated decode data into complete new decode data.

After all bits are decoded, the decode data is read, and a decode sequence is reversely generated according to the rule of constructing coding/decoding sub-trees.

The method provided in this embodiment of the present application will be described below.

In order to overcome the problems and defects of high resource overhead and large decoding delay during the Polar decoding process in the existing technology, a Polar code decoding scheme with low complexity and independent segmentation is provided. This scheme can obtain a U value required by calculation of a G node, and can realize independent and fast calculation.

An embodiment of the present application provides a Polar decoding method and apparatus with independent segmentation, so that multiple segments are calculated independently during the decoding process and do not depend on each other.

Figure 3:
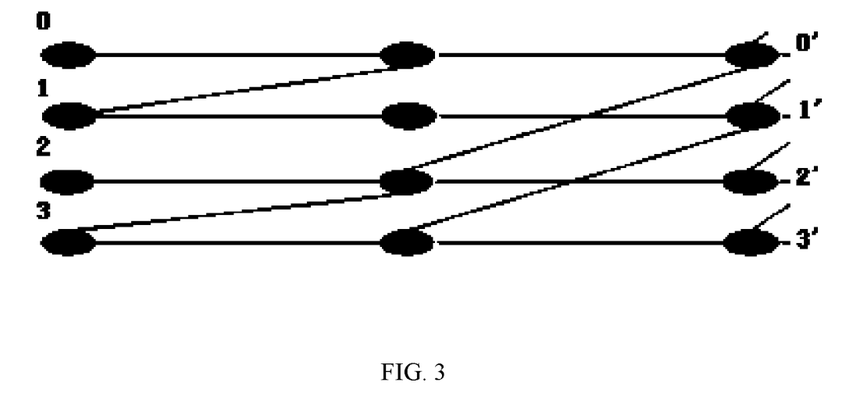
FIG. 3 is a structural diagram of decoding having a code length N of 4 according to an embodiment of the present application.

FIG. 3 is a structural diagram of decoding having a code length N of 4 according to an embodiment of the present application. As shown in FIG. 3, in the present application, the decoding array shown in FIG. 3 is an N-point coding/decoding tree. i(0), i(1), i(2) and i(3) are input values before encoding, and enc(0'), enc(1'), enc(2') and enc(3') are results after encoding. If it is assumed that one point is added each time and the calculation level is represented by idx, that is, idx=0 indicates the calculation of point 0, idx=1 indicates a new addition of point 1, idx=2 indicates a new addition of point 2 and idx=3 indicates a new addition of point 3, the encoding enablement of multiple points can be obtained:

en(0')=1
en(1')=idx[0]
en(2')=idx[1]
en(3')=idx[1]&idx[0], where $idx[i](i=0, \ldots, \log2(idx)-1)$ is the $i^{th}$ bit of the binary representation of idx.

The encoding formula of each point can be obtained according to the above formula:

enc(j')=en(j')&i(j)+enc(j'), j=0, . . . , log2(N)−1.

The above method is extended. If it is assumed that a vector $A=[i(0),i(1) \ldots i(N)]^T$ is input into the encoding array and the U value output after encoding is a vector $B=[enc(0),enc(1) \ldots enc(N)]^T$ (where N is the code length of the Polar code, and N=2n−1), the calculation expression (1) is as follows:

$$B^T = MA^T \quad (1),$$

where M is an encoding enablement matrix, and its numerical value is determined by calculation expression (2):

$$M = \begin{bmatrix} enc(0, idx=0) & enc(0, idx=0) & \ldots & enc(N, idx=0) \\ enc(1, idx=1) & enc(1, idx=1) & \ldots & enc(N, idx=1) \\ \ldots & \ldots & \ldots & \ldots \\ enc(0, idx=N) & enc(1, idx=N) & \ldots & enc(N, idx=N) \end{bmatrix} \quad (2)$$

$enc(x, idx) = idx[k-1]^{x[k-1]} \& idx[k-2]^{x[k-2]} \& \ldots \& idx[1]^{x[1]} \& idx[0]^{x[0]}$, where $idx = idx[k-1]*2^{k-1} + idx[k-2]*2^{k-2} + \ldots + idx[1]*2 + idx[0]$;

$x = x[k-1]*2^{k-1} + x[k-2]*2^{k-2} + \ldots + x[1]*2 + x[0]; k = \log2(N)$.

For each fixed point, the idx can be used as a unique input variable, and one point is newly added each time, so that the calculation of the U value can be completed by modulo-2 addition.

Based on the above analysis, it can be determined that, for any Polar decoding, the U value can be calculated in independent segments by the method of the present application. For example, the Polar decoding is divided into 4 sub-decoders, the calculation of the U value can be divided into 4 value calculation sub-modules in the same way, and the calculation formulae for the sub-modules are B[4i], B[4i-1], B[4i-2] and B[4i-3], respectively, where i=1,2 . . . N/4.

The method provided in this embodiment of the present application can be implemented by the following modules, including:

F_CALC and G_CALC modules: configured to complete the calculation of the Log-Likelihood ratio (LLR), the calculation of the F node and the calculation of the G node during the decoding process.

Microcontroller unit (MCU): configured to complete the decoding path expansion function.

Decode decision: configured to complete the screening of decoding paths and the decode decision output function.

U_CALC: configured to calculate a U value required by calculation of the G node according to the output value of the decode decision and transmit the U value to the F_CALC and G_CALC modules for a next iteration.

Decode output: configured to read decode data from the U_CALC module after all bits are decoded, and generate a N-bit decode sequence according to the rule of constructing coding/decoding sub-trees.

Based on the above modules, the method provided in this embodiment of the present application includes the steps of S01 to S06.

At step S01, a Polar decode tree is subjected to LLR calculation, path expansion and decode decision to output a decode value of a current iteration.

At step S02, coding/decoding sub-trees are constructed. If it is assumed that the Polar code has a code length of N, the data to be coded/decoded can be split into s independent sub-trees at a data extraction interval of s according to the characteristics of the Polar code tree, where $s=2^k, k=0, 1, 2 \ldots$.

At step S03, after m bits are decoded and output currently, the m-bit decode value is split into s sets by the extraction method in step S02, and the s sets are input into s independent U value calculation modules, respectively.

At step S04, the s independent U value calculation modules calculate a U value required by calculation at a next iteration of a G node according to the input decode value.

At step S05, steps S01-S04 are repeated until all bits are decoded.

At step S06, an operation reverse to the extraction method in step S02 is performed to generate an N-bit decode sequence by interpolation.

Figure 4:
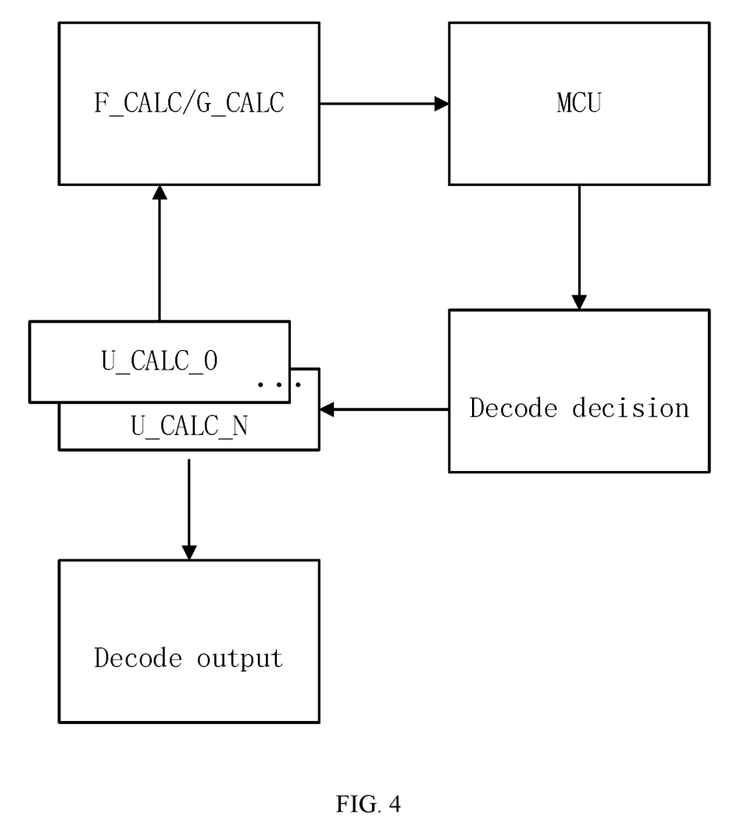
FIG. 4 is a flowchart of a decoding method according to an embodiment of the present application.

FIG. 4 is a flowchart of a decoding method according to an embodiment of the present application. As shown in FIG. 4, the F_CALC and G_CALC modules, the MCU module, the decode decision and the U_CALC perform cyclic iterative decoding until all bits are decoded. If it is assumed that m bits are decoded during each iteration process, the total number of iterations is N/m, where m is a positive integer.

Figure 5:
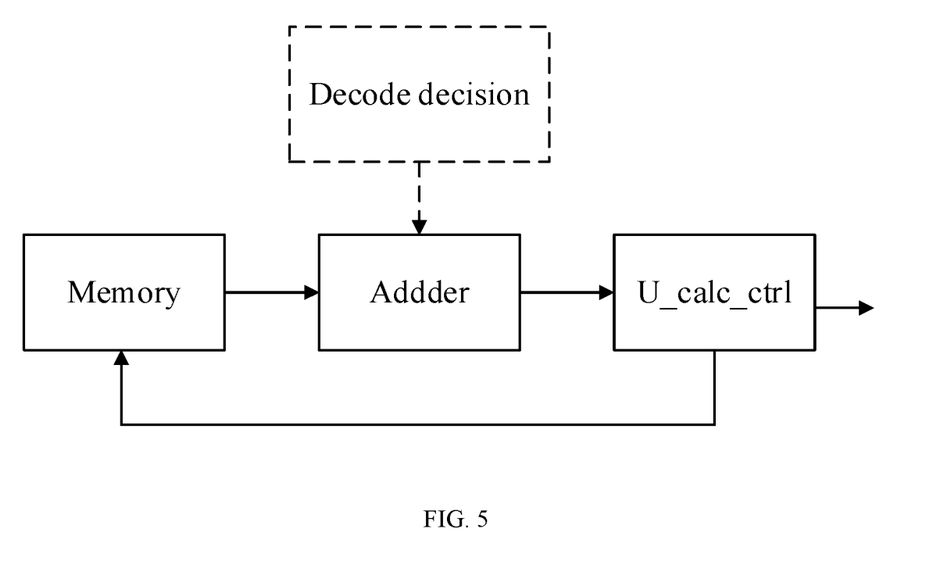
FIG. 5 is a schematic diagram of a processing flow of a U value calculation module according to an embodiment of the present application.

FIG. 5 is a schematic diagram of a processing flow of a U value calculation module according to an embodiment of the present application. As shown in FIG. 5, the calculation of the U value is completed by the above calculation expression (1). At the beginning of each iterative decoding, the above calculation expression (2) is updated to calculate a plurality of bit decoding enablement signals. After the Decode decision outputs a decode value, for a bit having a decoding enablement signal of 1, an Adder module is configured to perform modulo-2 addition on the decode value of this iteration and a previously decoded value, and the result is used as a U value required by calculation of a next decoding of the G node. For a bit having a decoding enablement signal of 0, the Adder module directly outputs the previously decoded value as a U value required by calculation of the next decoding of the G node. The U_calc_ctrl module selects and outputs the U value required by the operation of the G-CALC module, and controls the on or off of the G_CALC module. The U_calc_ctrl module is also responsible for storing the calculated U value in a memory for use in a next calculation of the U value. The U_calc_ctrl module also realized a pre-fetch function to pre-fetch the U value required by calculation at a next iteration, so that the Adder module can perform calculation immediately when the Decode decision outputs a decode value during the next iteration.

After all bits are decoded, the Decode output module is activated to read the decode data from the U_CALC module and reversely generate an N-bit decode sequence according to the rule of constructing coding/decoding sub-trees. For example, if it is assumed that decoding is divided into 4 sub-decoders, the bit decoded by each sub-decoder is A[4i], A[4i-1], A[4i-2] and A[4i-3], respectively, where i=1, 2 . . . N/4; and, the output data interpolated by this module is A[i], where i=1, 2 . . . N.

In this embodiment, the method for calculating the U value is not limited to any Polar code segmented decoding method, but it must be ensured that the data extraction rule for each segment is consistent with the data extraction rule for the calculation of the U value. If the Polar code decoding process is not segmented, the method for calculating the U value in this embodiment can also be used. The U value calculation is distributed in a plurality of independent U_CALC modules, and how many bits of decoding U value calculation each U_CALC module contains should be divided according to the hardware resources and layout to realize a tradeoff between performance and resources.

In accordance with the method provided in this embodiment of the present application, a plurality of decoding sub-trees can be calculated independently and do not depend on each other, the U value required by calculation of the G node can be calculated independently and quickly, and the resource consumption is very low.

Figure 6:
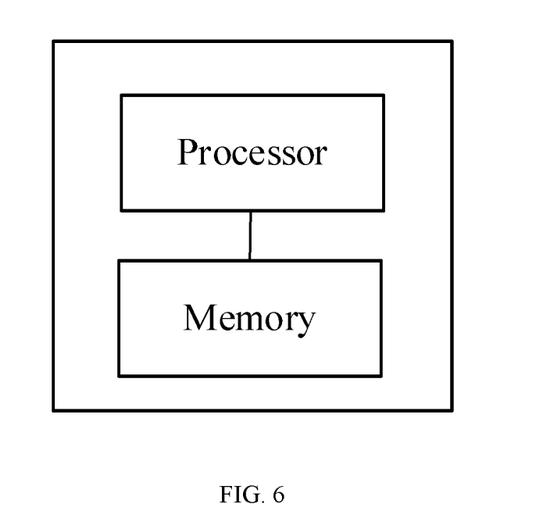
FIG. 6 is a schematic diagram of a data decoding apparatus according to an embodiment of the present application.

FIG. 6 is a schematic diagram of a data decoding apparatus according to an embodiment of the present application. As shown in FIG. 6, the data decoding apparatus includes a processor and a memory. The memory has stored thereon computer programs which, when executed by the processor, cause the processor to implement any one of the methods described above.

In accordance with the apparatus provided in this embodiment of the present application, after the data to be decoded is acquired, a Polar code tree corresponding to the data to be decoded is acquired, the Polar code tree is split into s independent decoding sub-trees, and a U value required at a next iteration of a G node is calculated using the s independent decoding sub-trees. During the decoding process, segments are calculated independently and do not depend on each other, so that the processing efficiency is improved.

An embodiment of the present application provides a computer storage medium having stored thereon one or more programs which, when executed by one or more processors, cause the one or more processors to implement any one of the methods described above.

In accordance with the computer storage medium provided in this embodiment of the present application, after the data to be decoded is acquired, a Polar code tree corresponding to the data to be decoded is acquired, the Polar code tree is split into s independent decoding sub-trees, and a U value required at a next iteration of a G node is calculated using the s independent decoding sub-trees. During the decoding process, segments are calculated independently and do not depend on each other, so that the processing efficiency is improved.

All or some of the steps in the methods described above and the functional modules/units in the systems and apparatuses described above may be implemented as software, firmware, hardware and proper combinations thereof. In the hardware implementation, the division of the functional modules/units mentioned above does not necessarily correspond to the division of physical components. For example, one physical component may have a plurality of functions, or one function or step may be cooperatively executed by a plurality of physical components Some or all of the components may be implemented as software executed by processors such as digital signal processors or microprocessors, or implemented as hardware, or implemented as integrated circuits such as application-specific integrated circuits. Such software may be distributed on a computer-readable medium, and the computer-readable medium may include computer storage medium (or non-temporary medium) and communication medium (or temporary medium). The term computer storage medium includes volatile or non-volatile and removable or non-removable medium implemented in any method or technology used to store information (such as computer-readable instructions, data structures, program modules or other data). The computer storage medium includes, but not limited to, random access memories (RAMs), read-only memories (ROMs), electrically erasable programmable read only memories (EEPROMs), flash memories or other memory technologies, compact disc read-only memories (CD-ROMs), digital versatile disks (DVDs) or other optical disk memories, magnetic cassettes, magnetic tapes, magnetic disk memories or other magnetic memory devices, or any other medium that can be configured to store desired information and can be accessed by computers. In addition, the communication medium generally contains computer-readable instructions, data structures, program modules or other data in modulation data signals such as carriers or other transmission mechanisms, and may include any information transfer medium.

The invention claimed is:

1. A data decoding method, performed by a receiver in a wireless communication system, comprising:
receiving a signal containing Polar code data to be decoded which is transmitted via the wireless communication system;
acquiring a Polar code tree corresponding to the Polar code data to be decoded;
splitting the Polar code tree into s independent decoding sub-trees, s being an integer greater than or equal to 2;
transmitting the s independent decoding sub-trees to s pre-configured independent U value calculation modules respectively, the U value calculation modules being configured to calculate a U value required at a next iteration of a G node;
controlling each of the s independent U value calculation modules to process a respective one of the s independent decoding sub-trees to obtain s sets of new decode data; and
executing an operation reverse to splitting pre-acquired decode data into s sets of decode data, to restore the s sets of new decode data to obtain new Polar code data to be decoded.

2. The method of claim 1, wherein the splitting the Polar code tree into s independent decoding sub-trees comprises:

acquiring a data extraction interval s for the Polar code tree; and performing data extraction on the Polar code tree at a data extraction interval of s bits and in a Z-shaped data extraction order to obtain the s independent decoding sub-trees.

3. The method of claim 1, wherein $s=2^k$, where k=1, 2, 3 . . . .

4. The method of claim 1, wherein the splitting the Polar code tree into s independent decoding sub-trees comprises:

acquiring a data extraction interval $s_i$ for the Polar code tree;

performing data extraction on the Polar code tree in a Z-shaped data extraction order and at a data extraction interval of $s_i$ bits to obtain $s_i$ independent decoding sub-trees;

determining whether a number of the obtained independent decoding sub-trees reaches s, to obtain a result of determination; and in response to the result of determination being that the number of the obtained independent decoding sub-trees does not reach s, splitting the $s_i$ independent decoding sub-trees, and updating a value of i as 1+1 until a total number of the obtained decoding sub-trees reaches s, i being a positive integer.

5. The method of claim 1, wherein the controlling each of the s independent U value calculation modules to process a respective one of the s independent decoding sub-trees to obtain s sets of new decode data comprises:

splitting pre-acquired decode data into s sets of decode data according to a pre-acquired strategy for splitting decode data, the strategy for splitting decode data being the same as a strategy for splitting the Polar code tree into s independent decoding sub-trees; and processing the s independent decoding sub-trees by using the s sets of decode data to obtain s sets of new decode data corresponding to the s independent decoding sub-trees.

6. A receiver in a wireless communication system comprising a data decoding apparatus, the data decoding apparatus comprising a processor and a memory, wherein the memory has computer programs stored thereon which, when executed by the processor, cause the receiver to perform a data decoding method, comprising:

receiving a signal containing Polar code data to be decoded which is transmitted via the wireless communication system;

acquiring a Polar code tree corresponding to the Polar code data to be decoded;

splitting the Polar code tree into s independent decoding sub-trees, s being an integer greater than or equal to 2;

transmitting the s independent decoding sub-trees to s pre-configured independent U value calculation modules respectively, the U value calculation modules being configured to calculate a U value required at a next iteration of a G node;

controlling each of the s independent U value calculation modules to process a respective one of the s independent decoding sub-trees to obtain s sets of new decode data; and executing an operation reverse to splitting pre-acquired decode data into s sets of decode data, to restore the s sets of new decode data to obtain new Polar code data to be decoded.

7. A non-transitory computer storage medium having at least one program stored thereon which, when executed by at least one processor of a receiver in a wireless communication system, causes the receiver to perform a data decoding method, comprising:

receiving a signal containing Polar code data to be decoded which is transmitted via the wireless communication system;

acquiring a Polar code tree corresponding to the Polar code data to be decoded;

splitting the Polar code tree into s independent decoding sub-trees, s being an integer greater than or equal to 2;

transmitting the s independent decoding sub-trees to s pre-configured independent U value calculation modules respectively, the U value calculation modules being configured to calculate a U value required at a next iteration of a G node;

controlling each of the s independent U value calculation modules to process a respective one of the s independent decoding sub-trees to obtain s sets of new decode data; and executing an operation reverse to splitting pre-acquired decode data into s sets of decode data, to restore the s sets of new decode data to obtain new Polar code data to be decoded.

8. The receiver of claim 6, wherein the splitting the Polar code tree into s independent decoding sub-trees comprises:

acquiring a data extraction interval s for the Polar code tree; and performing data extraction on the Polar code tree at a data extraction interval of s bits and in a Z-shaped data extraction order to obtain the s independent decoding sub-trees.

9. The receiver of claim 6, wherein $s=2^k$, where k=1, 2, 3 . . . .

10. The receiver of claim 6, wherein the splitting the Polar code tree into s independent decoding sub-trees comprises:

acquiring a data extraction interval $s_i$ for the Polar code tree;

performing data extraction on the Polar code tree in a Z-shaped data extraction order and at a data extraction interval of $s_i$ bits to obtain $s_i$ independent decoding sub-trees;

determining whether a number of the obtained independent decoding sub-trees reaches s, to obtain a result of determination; and in response to the result of determination being that the number of the obtained independent decoding sub-trees does not reach s, splitting the $s_i$ independent decoding sub-trees, and updating a value of i as i+1 until a total number of the obtained decoding sub-trees reaches s, i being a positive integer.

11. The receiver of claim 6, wherein the controlling each of the s independent U value calculation modules to process a respective one of the s independent decoding sub-trees to obtain s sets of new decode data comprises:

splitting pre-acquired decode data into s sets of decode data according to a pre-acquired strategy for splitting decode data, the strategy for splitting decode data being the same as a strategy for splitting the Polar code tree into s independent decoding sub-trees; and processing the s independent decoding sub-trees by using the s sets of decode data to obtain s sets of new decode data corresponding to the s independent decoding sub-trees.

12. The non-transitory computer storage medium of claim 7, wherein the splitting the Polar code tree into s independent decoding sub-trees comprises:

acquiring a data extraction interval s for the Polar code tree; and performing data extraction on the Polar code tree at a data extraction interval of s bits and in a Z-shaped data extraction order to obtain the s independent decoding sub-trees.

13. The non-transitory computer storage medium of claim 7, wherein $5=2^k$, where k=1, 2, 3 . . . .

* * * * *